United States Patent [19]

Ohtani

[11] Patent Number: 5,841,515
[45] Date of Patent: Nov. 24, 1998

[54] SUBSTRATE CONTAINER CASSETTE, INTERFACE MECHANISM, AND SUBSTRATE PROCESSING

[75] Inventor: Masami Ohtani, Kyoto, Japan

[73] Assignee: Dainippon Screen Mfg. Co., Ltd., Japan

[21] Appl. No.: 688,749

[22] Filed: Jul. 31, 1996

[30] Foreign Application Priority Data

Sep. 27, 1995 [JP] Japan .................................. 7-249748

[51] Int. Cl.$^6$ .......................... G03B 27/32; G03B 27/42; B65G 65/23
[52] U.S. Cl. .............. 355/27; 355/53; 414/935; 414/938
[58] Field of Search .................. 414/935, 938, 414/941; 355/27, 53

[56] References Cited

U.S. PATENT DOCUMENTS

| | | | |
|---|---|---|---|
| 4,350,116 | 9/1982 | Grandia et al. | 211/41.18 |
| 5,061,144 | 10/1991 | Akimoto et al. | 414/935 X |
| 5,183,370 | 2/1993 | Cruz | 414/941 X |
| 5,364,222 | 11/1994 | Akimoto et al. | 414/937 X |
| 5,492,229 | 2/1996 | Tanaka et al. | 211/41.18 |
| 5,564,889 | 10/1996 | Araki | 414/935 X |
| 5,577,621 | 11/1996 | Yi | 211/41.18 |
| 5,626,675 | 5/1997 | Sakamoto et al. | 414/935 X |
| 5,639,301 | 6/1997 | Sasada et al. | 414/935 X |

OTHER PUBLICATIONS

Monthly Magazine, Semiconductor World, Extra Edition, Chapter 1: 1996 The Latest Semiconductor Processing Technique "Lithography Technique" (pp. 118–119) by Dainippon Screen Mfg. including an English Abstract.

*Primary Examiner*—Fred L. Braun
*Attorney, Agent, or Firm*—Ostrolenk, Faber, Gerb & Soffen, LLP

[57] ABSTRACT

A substrate processing apparatus having improved processing and cleanliness characteristics is provided with a developer unit (160) and an exposure unit (170) that are positioned with operation parts of these units being arranged linearly. An interface mechanism (IFD), disposed between the developer unit (160) and the exposure unit (170), includes a substrate transport apparatus (TR2) which supports a peripheral portion of a substrate while transporting the latter. The interface mechanism (IFD) also includes a substrate container cassette (120) serving as a substrate buffer in which a substrate is supported from the back by three pins. Ejection of a substrate from an indexer (IDA) is controlled in accordance with the number of substrates which are present in a reciprocal path between the processing units (160) and (170).

15 Claims, 12 Drawing Sheets

SUBSTRATE CONTAINER CASSETTE, INTERFACE MECHANISM, AND SUBSTRATE PROCESSING

BACKGROUND OF THE INVENTION

1. Field of the Invention

The present invention relates to 1) a substrate container cassette which is usable as a substrate buffer between a plurality of processing units in an processing apparatus for a substrate such as a semiconductor wafer, 2) an interface mechanism which utilizes such a substrate container cassette to handle a substrate, and 3) a substrate processing apparatus which utilizes such an interface mechanism to efficiently transport a substrate.

2. Description of the Prior Art

As well known, in the art various types of substrates, such as a semiconductor wafer and a glass substrate for use in a liquid crystal display, are subjected to processing that includes various types of surface treatments such as coating, exposing and developing of a resist. An example of a conventional substrate processing is illustrated in the conceptual plan view of FIG. 12 apparatus which performs such processing. In particular, substrate processing apparatus 200 of FIG. 12 is for performing a series of treatments (exposing, developing, heating and cooling in this example) on a substrate 2 which is already coated with a resist, and is comprised of:

(1) a developer unit 280 which serves as a unit for developing;

(2) an exposure unit 290 which serves as a unit for exposing; and (3) an interface mechanism IFB for transporting a substrate between the developer unit 280 and the exposure unit 290.

The developer unit 280 is comprised of an indexer ID which supplies substrates 2, and a processing apparatus group 270 which performs developing, heating and cooling. The indexer ID includes a substrate container cassette 10 which is detachable and contains the substrate 2, and a substrate load/unload apparatus 220 which ejects the substrate 2 from the substrate container cassette 10 and transfers the same to the processing apparatus group 270. The processing apparatus group 270 is formed by a spin developer not shown (rotatable developing apparatus), a hot plate (heating apparatus), a cool plate (cooling apparatus) and a substrate transport apparatus. An operation part of the processing apparatus group 270 is formed in an end surface of the indexer ID which extends in a Y-direction (not shown). An operator operates the operation panel, standing at a position 200a.

The exposure unit 290 is formed by an exposure apparatus, a substrate load/unload apparatus which are not shown, and an operation part 260. Since the operation part 260 is formed in an end surface of the exposure unit which extends in an X-direction as shown in FIG. 12, an operator operates the operation part 260, standing at the position 200b.

The interface mechanism IFB includes a substrate transport apparatus 240 for transferring, loading and unloading the substrate 2, a transfer buffer 250 for transferring the substrate 2 to the exposure unit 290, and a substrate container cassette 210 which serves as a buffer apparatus for temporarily housing the substrate 2.

Now, procedures in which substrate processing apparatus performs the series of treatments will be described. First, the substrate load/unload apparatus 220 ejects the substrate 2 from the substrate container cassette 10. The substrate 2 is then transferred to the substrate transport apparatus of the processing apparatus group 270, and thereafter further to the substrate transport apparatus 240 of the interface mechanism IFB. Next, the substrate 2 is loaded into the transfer buffer 250 by the substrate transport apparatus 240, and further into the exposure apparatus by the substrate load/unload apparatus of the exposure unit 290 so as to be exposed. The exposed substrate 2 is then returned into the processing apparatus group 270 through the transfer buffer 250 and the interface mechanism IFB once again, to be developed, heated and cooled.

During the series of treatments described above, a trouble occurs (e.g., the timing of transferring is not matched) due to a difference in processing tacts (time required for the series of treatments) of the two processing units (the developer unit 280 and the exposure unit 290 in this example), which in turn makes it impossible to transfer substrates in some cases. If a trouble occurs, the substrate transport apparatus 240 temporarily houses the substrate 2 in substrate container cassette 210 which serves as a buffer apparatus, so that the interface mechanism IFB, the developer unit 280 and the exposure unit 290 stop operating.

Meanwhile, the conventional substrate container cassette 210 uses a cassette in which a groove is formed for peripheral support of the substrate. In relation to this, when the substrate transport apparatus 240 of the interface mechanism IFB mounts and transports the substrate 2, a transport arm (not shown) of the substrate transport apparatus 240 sucks the substrate 2 at a back surface thereof to support the substrate 2. This may allow a particle to adhere to the substrate 2 which is yet to be exposed or the sucking creates a contact mark on the substrate 2.

In addition, as shown in FIG. 12, since the developer unit 280 and the exposure unit 290 are linked to each other through the interface mechanism IFB in such a manner that the operation parts of the processing units 280, 290 (i.e., the indexer ID of the developer unit 280 and the operation part 260 of the exposure unit 290) are in different directions from each other, an operator must travel a long distance between a position 200a at which he or she operates these processing units and the position 200b. This degrades the operability of the substrate processing apparatus 200.

Further, since ejecting of the substrate by the indexer ID is controlled independently of the number of substrates which are contained within the interface mechanism IFB and the processing units, when the timing of transfer is not correct between the processing units and the interface mechanism IFB, or when it is impossible to receive the substrate due to a trouble, if the substrate 2 is ejected, the interface mechanism IFB will receive the substrates beyond its capacity. This disturbs smooth processing of the substrates.

SUMMARY OF THE INVENTION

The present invention is directed to a cassette for containing a plurality of substrates.

According to the present invention, the cassette comprises: a) a plurality of supporting means alternately stacked with gap spaces, each of the plurality of supporting means having a plurality of top points horizontally distributed within an area smaller than a size of each substrate to horizontally support one substrate; and b) holding means for holding the plurality of supporting means.

The present invention is also directed to an interface between first and second processing units for processing substrates. According to the present invention, the interface comprises: a) a substrate buffer for buffering transportation of substrates between the first and second processing units; and b) a handling mechanism operable to take each substrate into and out of the substrate buffer, wherein the substrate buffer has a-1) a plurality of supporting means alternately stacked with gap spaces, each of the plurality of supporting means having a plurality of top points horizontally distributed within an area smaller than a size of each substrate to horizontally support one substrate; and a-2) holding means for holding the plurality of supporting means.

The present invention is also directed to an apparatus for processing substrates. According to the present invention, the apparatus comprises: a) first and second processing units for processing substrates; and b) an interface provided between the first and second processing units, having b-1) a substrate buffer for buffering transportation of substrates between the first and second processing units; and b-2) a handling mechanism operable to take each substrate into and out of the substrate buffer, wherein the substrate buffer has b-1-1) a plurality of supporting means alternately stacked with gap spaces, each of the plurality of supporting means having a plurality of top points horizontally distributed within an area smaller than a size of each substrate to horizontally support one substrate; and b-1-2) holding means for holding the plurality of supporting means.

In one aspect of the present invention, respective substrates are serially transported along a shuttle path including a forward path starting from the first processing unit to the second processing unit via the interface, and a back path coming back to the first processing unit from the second processing unit via the interface, and the first processing unit has a-1) a loader for serially loading respective substrates in the first processing unit, and a-2) transfer means for serially transferring respective substrates to the interface, the apparatus further comprising: c) means for counting the number of substrates currently present in the shuttle path; d) means for comparing the number of the substrate with a reference number; and e) means for controlling the loader to interrupt loading of new substrates should the number of the substrates exceeds the reference number.

Accordingly, a first object of the present invention is to provide for a substrate container cassette which maintains substrates clean.

A second object of the present invention is to provide for an interface mechanism that includes a substrate transport apparatus which transports substrates while maintaining them clean.

A third object of the present invention is to shorten the distance an operator is required to travel when he uses a substrate processing apparatus and to improve the operability of the substrate processing apparatus.

A fourth object of the present invention is to provide a substrate processing apparatus which operates smoothly to processes substrates while controlling the number of substrates which are present within an interface mechanism and processing units.

These and other objects, features, aspects and advantages of the present invention will become more apparent after reading from the following detailed description of the present invention when taken in conjunction with the accompanying drawings in which:

DESCRIPTION OF THE PREFERRED EMBODIMENTS

In the following, a preferred embodiment of the present invention will be described with reference to the accompanying drawings.

Figure 1:
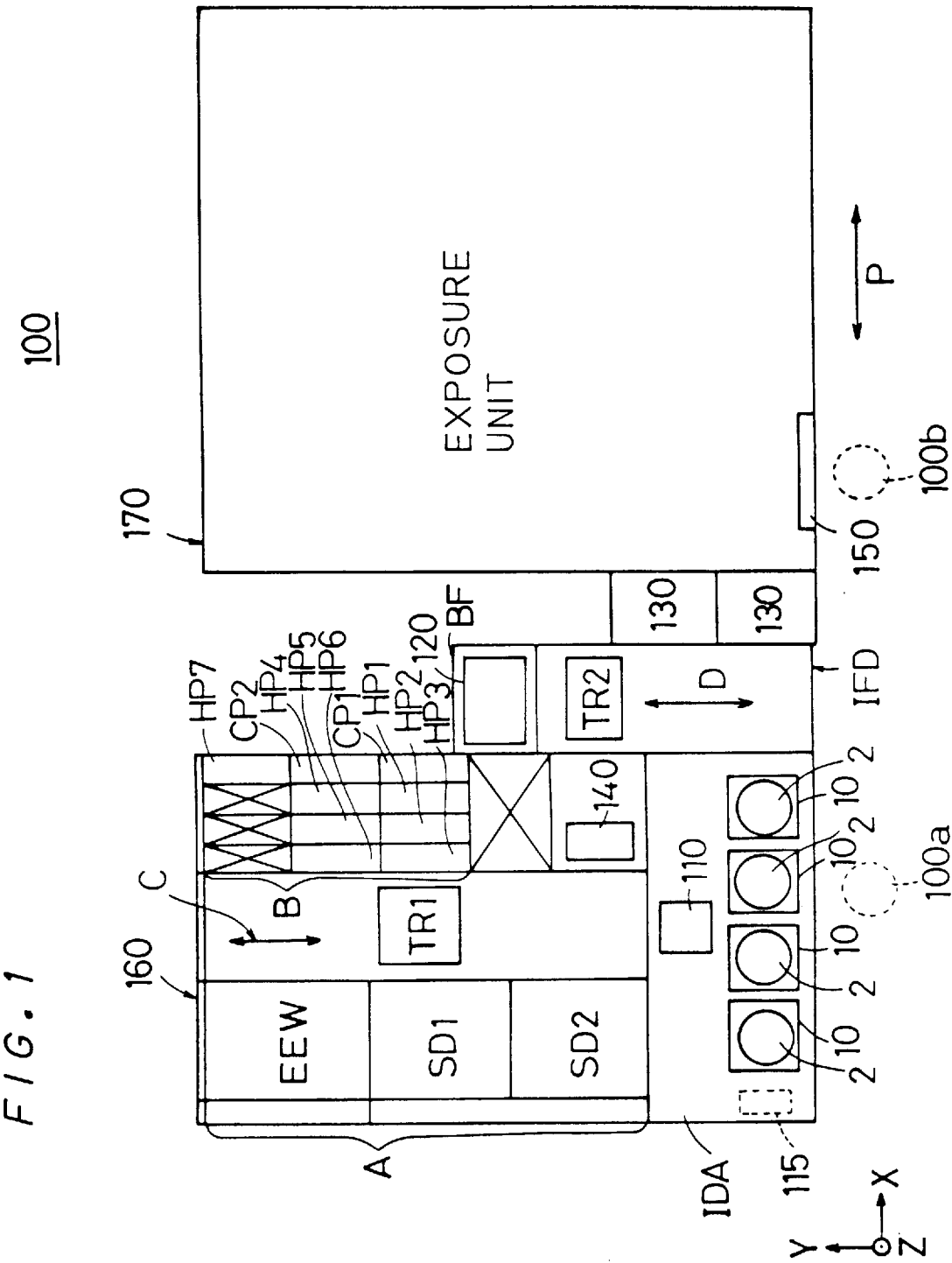
FIG. 1 is a conceptual plan view of a substrate processing apparatus constructed according to a preferred embodiment of the present invention.

A. Overall Structure of Substrate Processing Apparatus:

FIG. 1 is a conceptual plan view of a substrate processing apparatus 100 according to the present invention which apparatus 100 incorporates a substrate container cassette and an interface mechanism. The substrate processing apparatus 100 is formed by a developer unit 160 and an exposure unit 170 which are spaced from one another, and an interface mechanism IFD which is disposed between the two units 160, 170.

A-1. Structure Of Developer Unit:

The developer unit 160 is a processing unit for developing a substrate 2 (a semiconductor wafer in this example), that has been exposed and is formed by an indexer IDA, a processing apparatus array A, a processing apparatus array B, a substrate transfer apparatus 140, and a substrate transport apparatus TR1. The developer unit 160 is disposed next to the interface mechanism IFD in an X-direction, as shown in FIG. 1.

The indexer IDA includes a detachable substrate container cassette 10 in which substrates 2 each coated with a resist are stacked one atop the other, and a substrate load/unload apparatus 110 which is freely moved in the X-direction when driven by driving means (not shown.) The substrate load/unload apparatus 110 is capable of ejecting the substrates 2 from the cassette 10 and discharging the substrates 2 to the interface mechanism IFD through the substrate transport apparatus TRI and the substrate transfer apparatus 140. Ejecting of the substrates performed by the substrate load/unload apparatus 110 is controlled by a control part 115 which is disposed within the indexer IDA. The indexer IDA corresponds to the operation part of the developer unit 160. An operator stands at a position 100a and manipulates the operation part.

The processing apparatus array A is formed by arranging spin developers SD1, SD2 and an edge exposure apparatus EEW in a Y-direction. In a structure facing the processing apparatus array A, there are a plurality of hot plates (heating apparatuses) HP1 to HP7 for performing various types of heating operations and cool plates (cooling apparatuses) CP1, CP2. Although FIG. 1 shows these units in a plan view for convenience of illustration, the hot plates HP1 to HP3 are disposed in this order on the cool plate CP1 at a position closest to the indexer IDA, for example. These units as a whole extend in the Y-direction to form the processing apparatus array B. The edge exposure apparatus EEW is an apparatus for exposing a peripheral part of each substrate 2 before developing the same so that a resist is removed during developing, but is different from an exposure apparatus which transfers a pattern. In this embodiment, the edge exposure apparatus EEW is one of the sections which form the developer unit.

In an area between the processing apparatus array A and the processing apparatus array B, a transport area C is created in the Y-direction. In the transport area C, substrate transport apparatus TR1 is freely moved in area C in the Y-direction when driven by driving means (not shown).

Further, the substrate transfer apparatus 140 is disposed on the same line with the processing apparatus array B. The substrate transfer apparatus 140 functions to transfer substrates 2 between substrate transport apparatus TR2 of the interface mechanism IFD and the substrate transport apparatus TR1.

Figure 2:
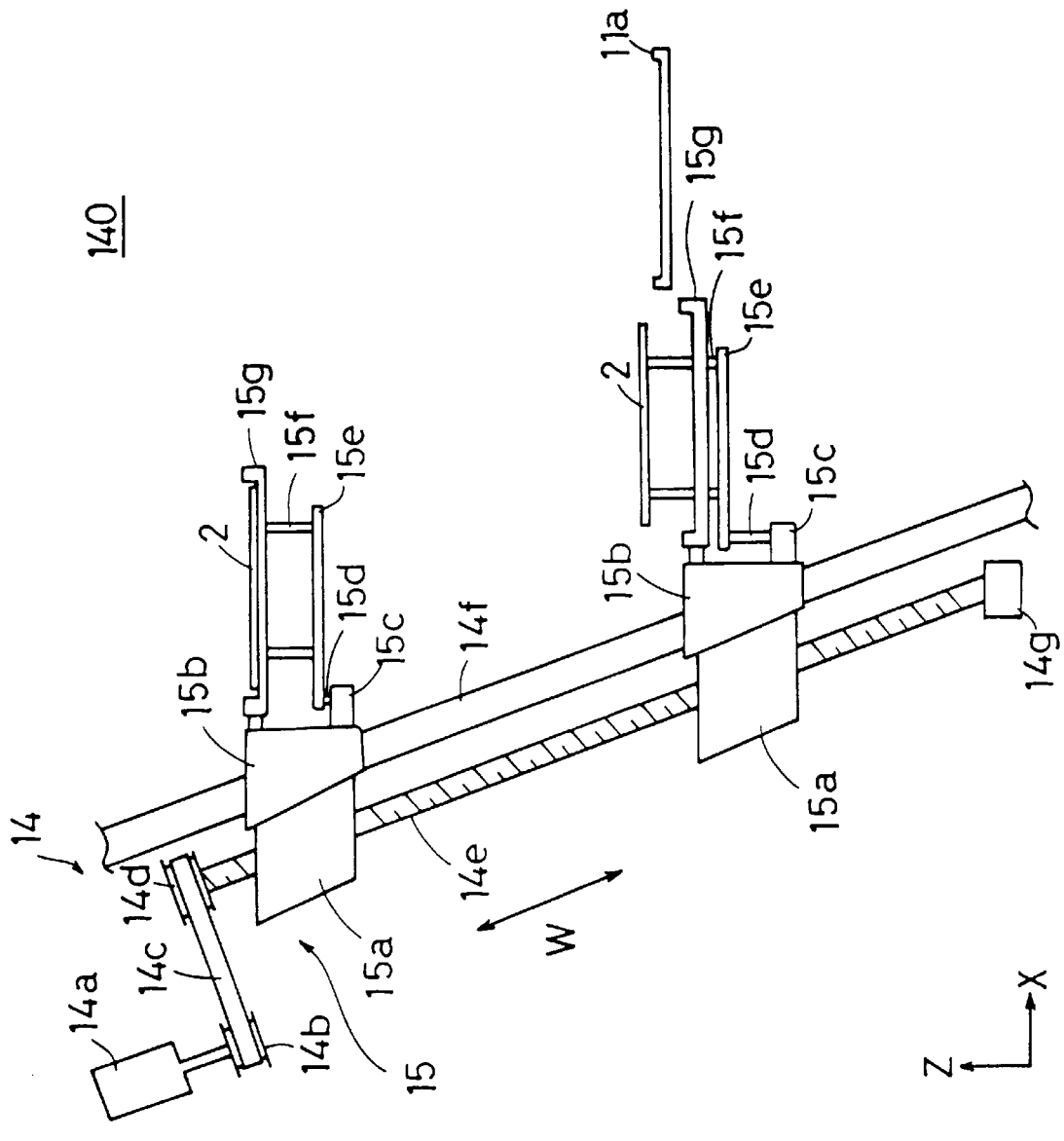
FIG. 2 is a side view of a substrate transfer apparatus used in the preferred embodiment of FIG. 1.

FIG. 2 is a side view of transfer apparatus 140. The substrate that includes a substrate transfer part 15 and a driving mechanism 14 for driving the substrate transfer part 15. Although FIG. 2 shows two substrate transfer parts 15, in reality, there is only one substrate transfer part 15. That is, FIG. 2 illustrates the position of the substrate transfer part 15 as it is before being moved as well as; the position of the substrate transfer part 15 as it is after being moved.

The driving mechanism 14 includes a motor 14a which is fixed to a housing of the developer unit 160, and a pulley 14b on the output shaft of the motor 14a. In addition, an external screw 14e is disposed upright to the driving mechanism 14 along a diagonal direction W within an XZ plane in FIG. 2. One end of the external screw 14e is linked directly to a pulley 14d, while the other end of the external screw 14e is supported by a bearing 14g. Rotation of the motor 14a is transmitted to the external screw 14e through the pulley 14b, a belt 14c and the pulley 14d, so that, as the motor 14a rotates, the external screw 14e rotates.

On the other hand, the substrate transfer part 15 includes an internal screw 15a. That is linked directly to a moving pedestal 15b which is engaged with a linear guide 14f for free sliding movement. The linear guide 14f is disposed upright in the diagonal direction W in FIG. 2, and is supported at its opposite ends by parts (not shown) in FIG. 2. The internal screw 15a is threadingly engaged with the external screw 14e. Since the external screw 14e and the linear guide 14f are disposed along the diagonal direction W, rotation of the motor 14a in a forward or a reverse direction allows the substrate transfer part 15 to move freely in the diagonal direction W.

A substrate support member 15g, which serves as an arm for supporting the substrate 2 at a peripheral back surface portion of the substrate 2, and a cylinder 15c are linked to the substrate support member 15b. A piston 15d is inserted into the cylinder 15c. A horizontal pedestal 15e to which a transfer pin 15f is disposed upright is linked to the piston 15d. As the piston 15d is moved upward and downward by the cylinder 15c, the transfer pin 15f and the horizontal pedestal 15e are raised and lowered. If the substrate is placed on the substrate support member 15g, as the transfer pin 15f is moved upward and downward, the substrate 2 is raised and lowered.

Next, a brief description will be given on the procedures of transferring a substrate by the substrate transfer part 15. To receive the substrate 2 from the interface mechanism IFD side, the substrate transfer part 15 moves to a predetermined position (which is faced with the substrate transport apparatus TR2 of the interface mechanism IFD) at a lower front side (i.e., lower right-hand side in FIG. 2). Following this, with the transfer pin 15f moved to an elevated position, a transport arm 11a of the substrate transport apparatus TR2, which will be described later, hands over the substrate 2. The transfer pin 15f is thereafter moved downward, and with the substrate support member 15g supporting the substrate 2, the substrate transfer part 15 is moved upward to an upper rear predetermined position (which is faced to the substrate transport apparatus TR1) along the diagonal direction W. With the transfer pin 15f moved to the elevated position thereby raising the substrate 2, a transport arm of the substrate transport apparatus TR1, which is not shown, receives the substrate 2, whereby handing over of the substrate 2 is realized.

A reverse operation is performed, when the substrate transfer part 15 is to receive the substrate 2 from the substrate transport apparatus TR1 and hand over the substrate 2 to the interface mechanism IFD. Further, the substrate transport apparatus TR1 is the same as the substrate transport apparatus TR2 of the interface mechanism except for including two transport arms 11a, one above and the other below, and therefore, will be described later.

A-2. Structure Of Exposure Unit:

Referring back to FIG. 1, the exposure unit 170 is a processing unit which exposes the substrate 2 after the substrate 2 is coated with a resist, and is disposed on an opposite side to the developer unit 160 through the interface mechanism IFD. The exposure unit 170 is formed by an exposure apparatus not shown, a substrate load/unload apparatus and an operation part 150. The operation part 150 is disposed in front of the exposure unit 170, as shown in FIG. 1, so that an operator operates the operation part 150, standing at a position 100b. Hence, when one operator operates the substrate processing apparatus 100 according to this embodiment, the operator only has to travel between the position 100a and the position 100b which are on the same line P. Thus, a distance the operator needs to move is short, and therefore, the operability of the substrate processing apparatus is improved.

A-3. Structure Of Interface Mechanism:

The interface mechanism IFD is capable of receiving a resist-coated substrate 2 which is ejected from the indexer IDA through the substrate transport apparatus TR1 and the substrate transfer apparatus 140, loading the resist-coated substrate 2 into the exposure unit 170, receiving an exposed substrate 2 and moving the exposed substrate 2 into the substrate transfer apparatus 140 of the developer unit 160. For this reason, the interface mechanism IFD is disposed between the developer unit 160 and the exposure unit 170.

The interface mechanism IFD includes the substrate transport apparatus TR2 which transfers, loads and unloads the substrates 2, and is freely movable in the Y-direction within a transport area D. In addition, the interface mechanism IFD includes a substrate container cassette 120 which serves as a buffer apparatus BF for temporarily housing the substrates 2, and two buffers 130 which transfers the substrates with the exposure unit 170.

Figure 3:
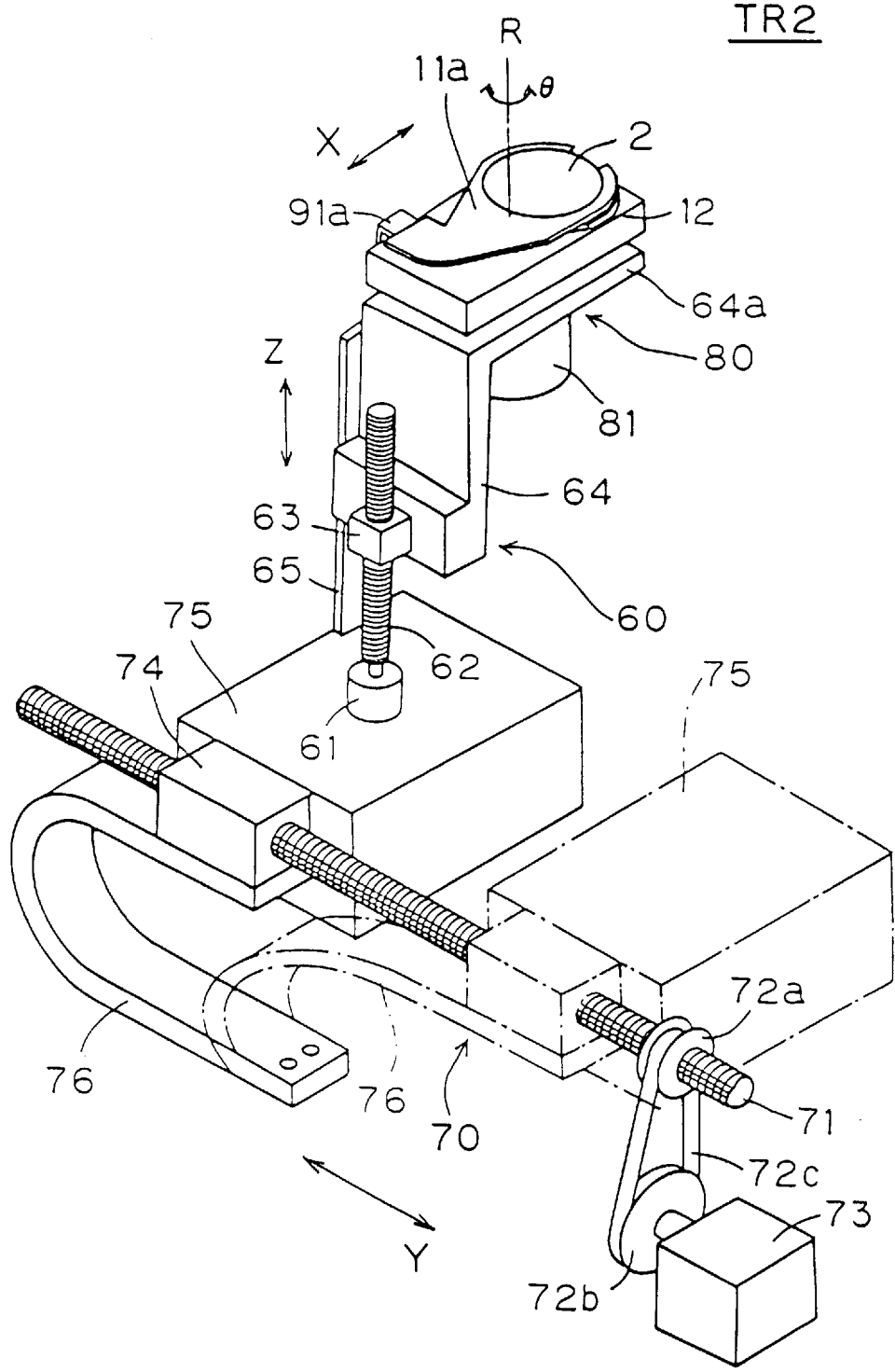
FIG. 3 is a perspective of a substrate transport apparatus used in the preferred embodiment.

FIG. 3 is a perspective view showing the substrate transport apparatus TR2 in detail. The transport arm 11a is secured to a movable member 12 which is freely rotatable. A move mechanism for three-dimensionally moving the transport arm 11a is formed by an X-direction move mechanism (not shown) which moves the movable member 12 in the horizontal X-direction, a Z-direction move mechanism 60 which moves the transport arm 11a and the movable member 12 in an upright Z-direction, a Y-direction move mechanism 70 which moves the transport arm 11a and the movable member 12 in a horizontal Y-direction, and a rotating mechanism 80 which rotates the movable member 12 to rotate the X-direction mentioned above in which the transport arm 11a is rotated.

In the Y-direction move mechanism 70, an external screw 71 which is a ball screw is disposed to extend along a longitudinal direction (i.e., Y-direction in FIG. 3) of the transport area D which is shown in FIG. 1. External screw 71 extends along the longitudinal direction of the transport area D, with both ends of screw 71 reaching the ends of areaD and being supported for free rotation outside of the region shown in FIG. 3. A pulley 72a is fixed to one end portion of the external screw 71. Since rotation of a motor 73 which is disposed in the interface mechanism is transmitted to the pulley 72a through a pulley 72b and a belt 72c, as the motor 73 rotates, the external screw 71 rotates. An internal screw 74 which is a ball screw is engaged with the external screw 71. A Y-direction move pedestal 75 and a link 76 are linked to the internal screw 74. As the motor 73 rotates forward or backward, the Y-direction move pedestal 75 is moved reciprocally in the Y-direction, as shown by the dashed-and-dotted lines in FIG. 3.

In the Z-direction move mechanism 60, a motor 61 is attached to the Y-direction move pedestal 75, and an external screw 62 is linked directly to a rotation shaft of the motor 61. The external screw 62 extends in an upright direction (Z-direction) which is perpendicular to the Y-direction, with the other end supported outside FIG. 3 for free rotation. An internal screw 63 is engaged with the external screw 62, and a Z-direction move pedestal 64 is fixed to the internal screw 63. The Z-direction move pedestal 64 is guided by a guide 65 which is disposed upright to the Y-direction move pedestal 75. As the motor 61 rotates forward or backward, the Z-direction move pedestal 64 is raised and lowered in the Z-direction along the external screw 62.

The Z-direction move pedestal 64 includes a horizontal portion 64a at the top, and a rotation mechanism 80 is disposed in the horizontal portion 64a. In the rotation mechanism 80, a motor 81 is attached to a bottom surface of the horizontal portion 64a in such a manner that a rotation shaft (not shown) of the motor 81 coincides with an axis R which is parallel to the Z-direction. The rotation shaft of the motor 81 penetrates the horizontal portion 64a, reaching a top surface of the horizontal portion 64a. The movable member 12 is secured to the rotation shaft of the motor 81. Hence, as the motor 81 rotates, the movable member 12 turns around in a θ-direction about the axis R.

Although not shown, the movable member 12 includes an X-direction move mechanism which advances and retracts the transport arm 11a in the X-direction. The X-direction move mechanism includes a guide rail (not shown) which extends in the X-direction in a side surface of the movable member 12, a slide arm 91awhich is moved as it is guided along the guide rail and supports the transport arm 11a, and a drive apparatus (not shown) which is formed by a motor, a wire, a pulley, etc., which reciprocally move the slide arm 91a. As the motor of the drive apparatus (not shown) rotates, the transport arm 11a is advanced and retracted.

Figure 4:
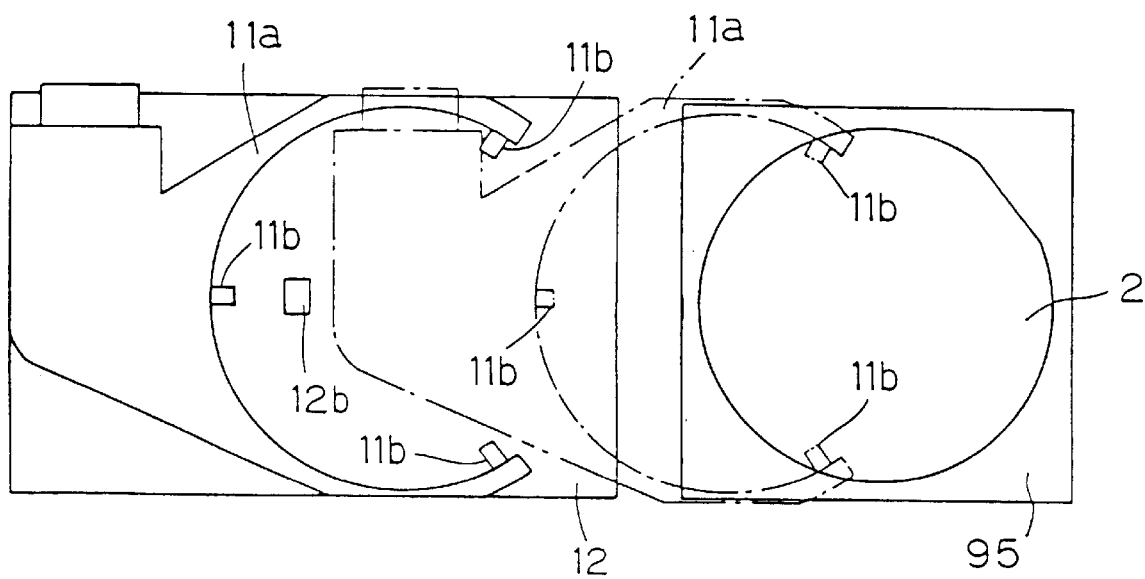
FIG. 4 is a diagram for describing an arrangement of a movable member, an arm and the like of the substrate transport apparatus.

FIG. 4 is a plan view which describes the structures of the movable member 12 and the transport arm 11a which are shown in FIG. 3, showing a positional relationship between the movable member 12 and the transport arm 11a against a substrate transfer position 95 as the movable member 12 and the transport arm 11a are at their access positions for exchanging of the substrates 2.

The transport arm 11a is disposed on the movable member 12, and so is a sensor 12b to avoid interference with the transport arm 11a. The inner diameter of the transport arm 11a is larger than an outer diameter of the substrate 2. A support member 11b for supporting the periphery of the substrate 2 is disposed to the transport arm 11a. The sensor 12b is an optical sensor which emits inspection light upward and detects returning light which is reflected by the substrate 2. The sensor 12b detects whether there is the substrate 2 immediately above the sensor 12b. The sensor 12b is not limited to a reflection type sensor, but rather may be a transmission type sensor. Further, other types of sensors except for optical sensors, e.g., an electro-static sensor may be used. By reading a detection output from the sensor 12b at appropriate timing, it is possible to steadily monitor whether there is the substrate 2 on the transport arm 11a during exchanging of the substrates 2 between the transport arm 11a and the substrate transfer position 95.

In the example shown in FIG. 4, the substrate 2 is not placed on the transport arm 11a but is positioned at the substrate transfer position 95. From this condition, the transport arm 11a is advanced to immediately below the substrate 2. Following this, the transport arm 11a is raised by the Z-direction move mechanism 60 to receive the substrate 2. The transport arm 11a is thereafter retracted to the original position on the movable member 12. This completes a cycle of receiving of the substrate. Handing over of substrates 2 is realized by reversely following this process. That is, with the substrate 2 mounted on the transport arm 11a, the transport arm 11a is advanced immediately above the substrate transfer position 95. The transport arm 11a is then lowered by the Z-direction move mechanism 60 to hand over the substrate 2. The transport arm 11a is thereafter retracted to the original position on the movable member 12. This completes a cycle of handing over of the substrate.

Figure 5:
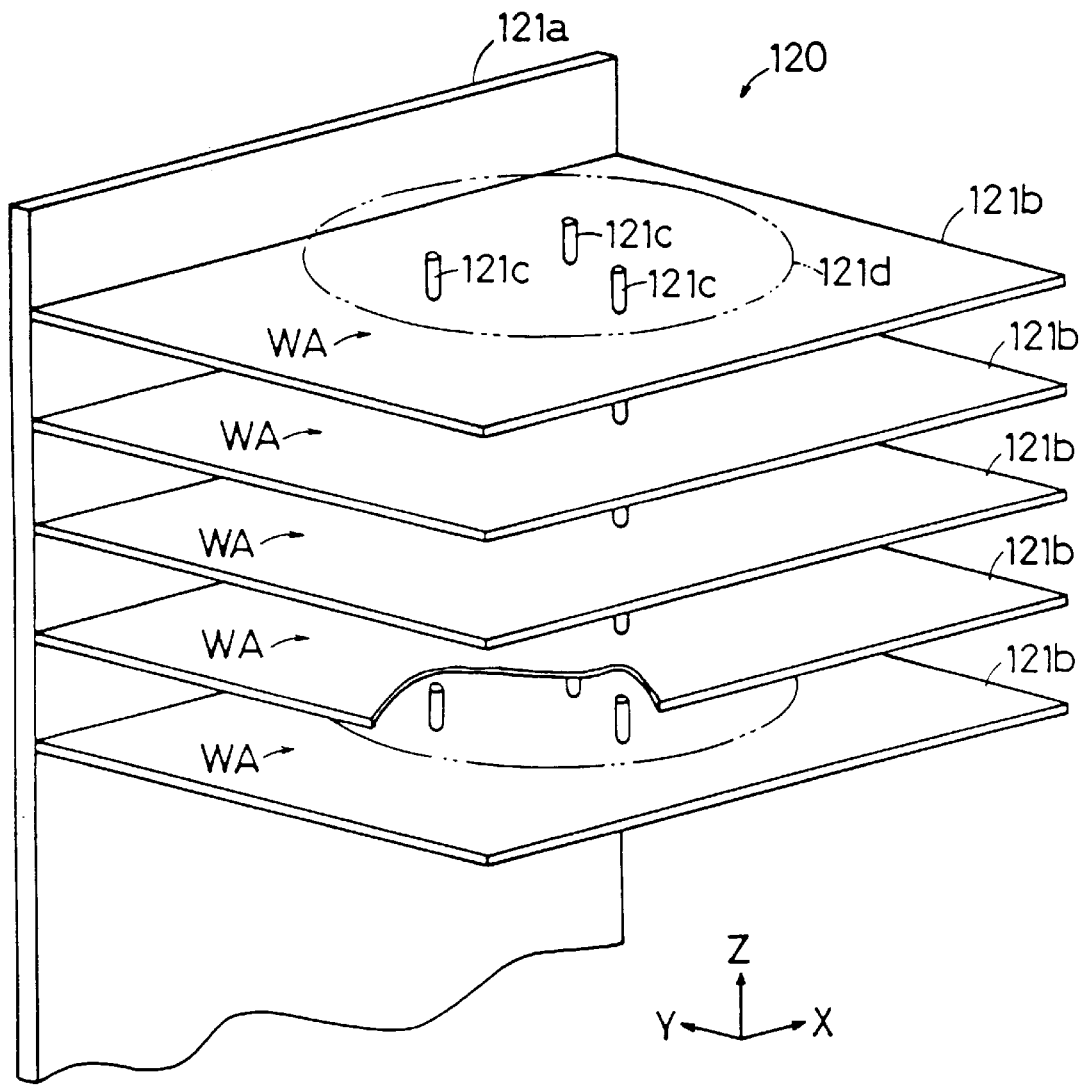
FIG. 5 is a perspective of an exemplary substrate container cassette.

FIG. 5 is a perspective view showing an example of the substrate container cassette 120 which temporarily houses the substrates 2.

As shown in FIG. 5, in the substrate container cassette 120, a support wall 121a is disposed in an upright direction (Z-direction) to the interface mechanism IFD. A plurality of horizontal plates 121b are stacked with a distance from each other and fixedly linked to the support wall 121a. Pin-like members 121c are disposed to each horizontal plate 121b. Three pin-like members 121c are disposed in an upright direction (Z-direction) to the horizontal plate 121b to form a triangle shape within an approximately horizontal range 121d which is smaller than the size (plan size) of a substrate. Each horizontal plate 121b and three corresponding pin-like members 121c form one substrate container portion WA. A plurality of such substrate container portions WA are stacked one atop the other into a plurality of layers with a distance from each other, whereby the substrate container cassette 120 is formed.

Figure 6A:
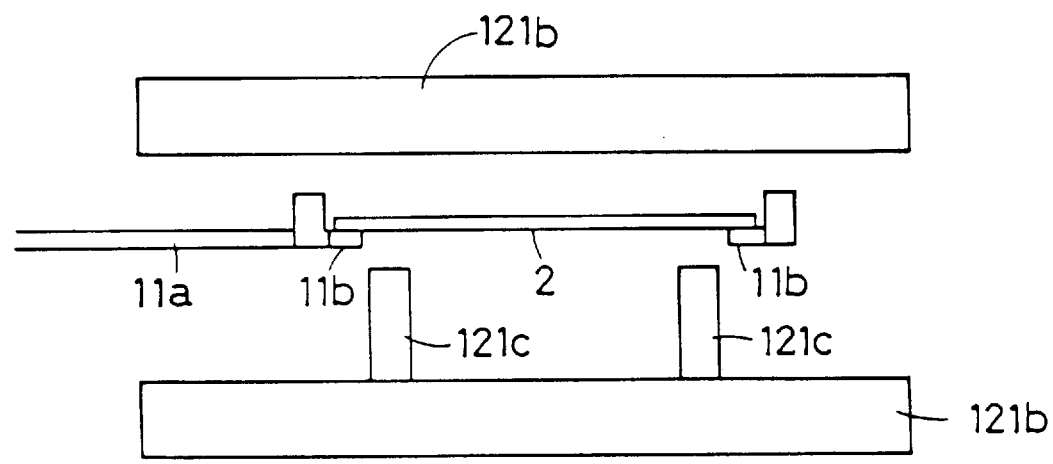
FIGS. 6A and 6B are diagrams for describing transferring of a substrate in the preferred embodiment.
Figure 6B:
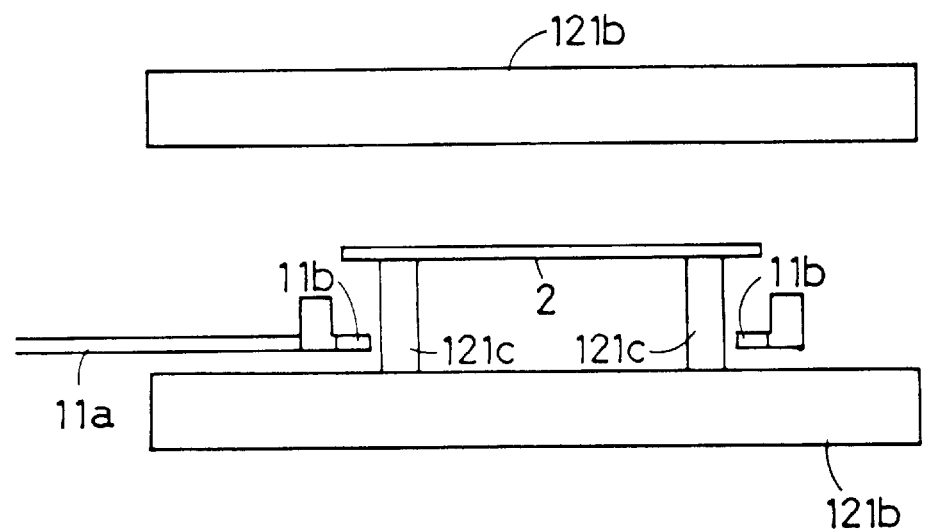

FIGS. 6A and 6B are diagrams for specifically describing housing of the substrate 2 into the substrate container cassette 120 by the transport arm 11a of the substrate transport apparatus TR2. As shown in FIG. 6A, the transport arm 11a is advanced so that the substrate 2 is positioned immediately above the pin-like members 121c. Following this, the Z-direction move mechanism 60 shown in FIG. 3 is driven to lower the transport arm 11a and places the substrate 2 onto the pin-like members 121c as shown in FIG.

6B. The transport arm 11a is then moved backward, which completes the housing operation. Receiving of the substrate from the substrate container cassette 120 is realized by reversely following this process. That is, the transport arm 11a is advanced immediately below the substrate 2. Following this, the transport arm 11a is raised to receive the substrate 2. The transport arm 11a is then moved backward, which completes the receiving operation. For this purpose, the horizontal portions 121b are arranged with a distance from each other which are wider than a width with which the horizontal portions 121b do not interfere with vertical movement of the transport arm 11a.

In the substrate container cassette 120 as that shown in FIG. 5, the back surface of the substrate 2 is supported by three pin-like members 121c whose tips are arranged in a non-linear configuration within the approximately horizontal range 121d which is smaller than the size (plan size) of the substrate 2, and the periphery portion of the substrate 2 is supported by the transport arm 11a, so that it is possible to transfer the substrate 2 between the substrate transport apparatus TR2 and the substrate container cassette 120. Hence, there is no possibility that particles will adhere to the back surface of the substrate nor a contact mark will not be created due to sucking. Further, when the substrate 2 is housed in the substrate container cassette 120, since the substrate 2 contacts only the tips of the three pin-like members 121c, a contact area is very small, and therefore, the substrate 2 is kept clean. Still further, since the three pin-like members 121c support the substrate 2 from the back, the substrate 2 is supported horizontally. This eliminates the disadvantage with the conventional cassette that the substrate 2 is inclined forward within the substrate container cassette 120 and the substrate transport apparatus TR2 accordingly interferes with the substrate 2.

Figure 7:
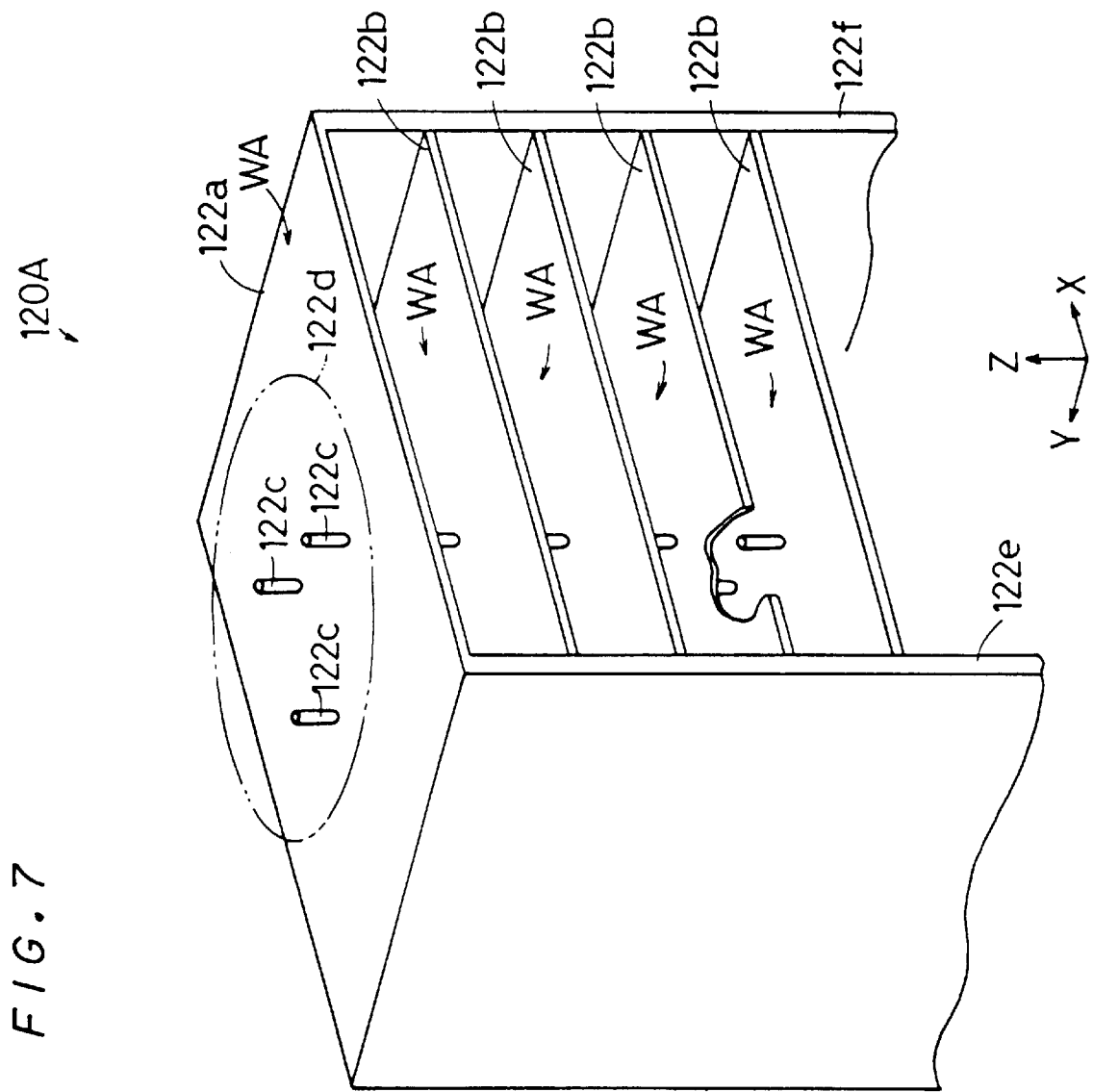
FIGS. 7 and 8 are perspectives showing different variations of cassette structure to be used in place of the substrate container cassette of FIG. 5.

While the substrate container cassette 120 as that shown in FIG. 5 is used in this example, the substrate container cassette may have the following structure. For instance, in a substrate container cassette 120A shown in FIG. 7, two support plates 122e, 122f are disposed perpendicularly (i.e., in the Z-direction) to the interface mechanism IFD, and a roof plate 122a is bridged between the two support plates 122e, 122f. Horizontal plates 122b are fixedly linked to the support plates 122e, 122f, with a distance from each other which prevent the horizontal plates 122b from interfering vertical movement of the transport arm 11a. To each horizontal plate 122b, three pin-like members 122c are disposed in an upright direction (Z-direction) which is perpendicular to the horizontal plate 122b to form a triangle shape within an approximately horizontal range 122d which is smaller than the size (plan size) of a substrate. In this structure, an upper portion of the roof plate 122a is one of the substrate container portions WA.

Figure 8:
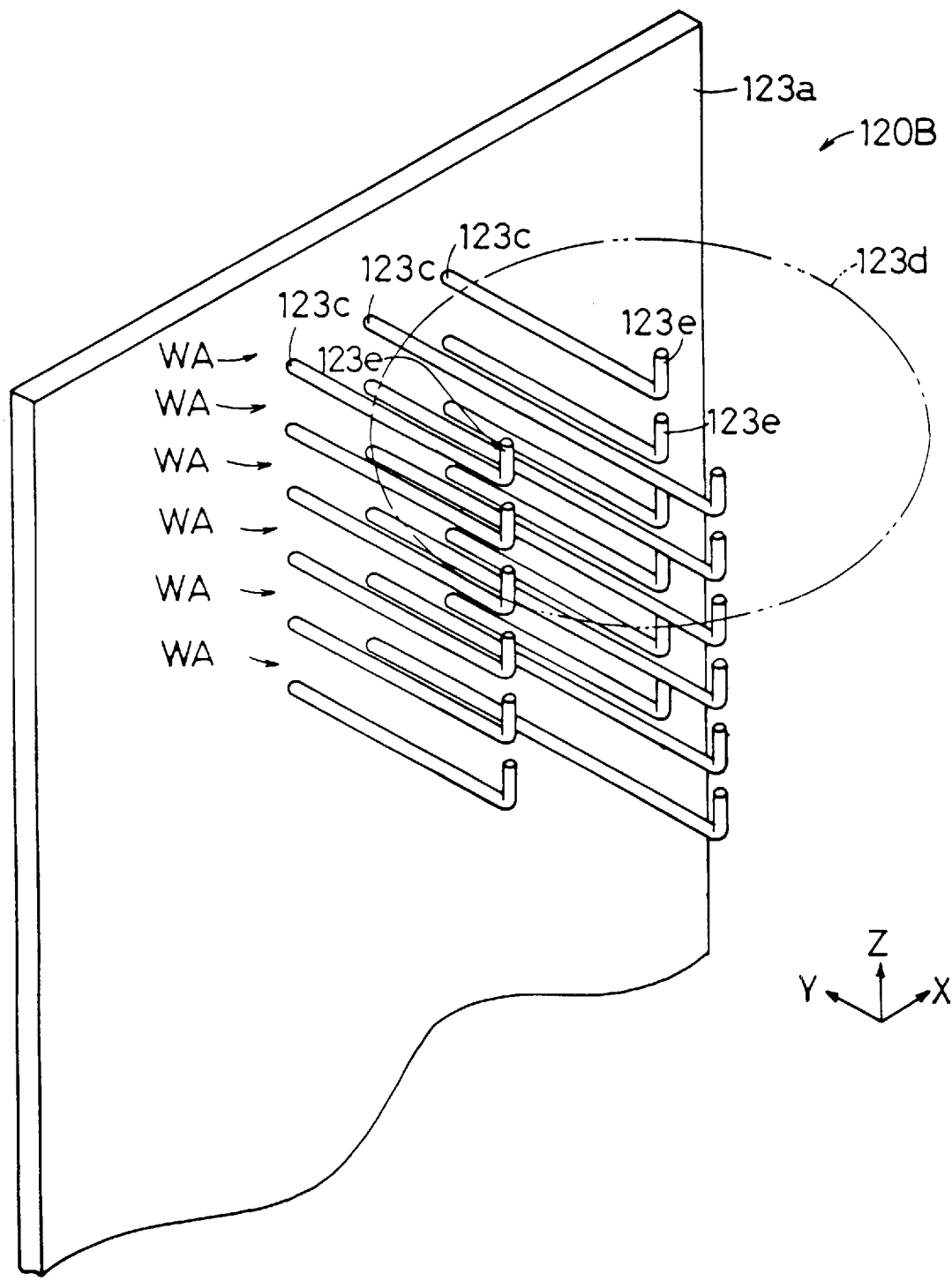

In a substrate container cassette 120B shown in FIG. 8, a support wall 123a is disposed perpendicularly (i.e., in the Z-direction) to the interface mechanism IFD. Pin-like members 123c are fixedly linked to the support wall 123a in the horizontal direction (Y-direction) which is perpendicular to the support wall 123a. Tip portions 123e of the pin-like members 123c are bent to extend in the upright direction (Z-direction). Three tip portions 123e are disposed to form a triangle shape within an approximately horizontal range 123d which is smaller than the size (plan size) of a substrate. The pin-like members 123c, as well, are stacked one atop the other in the upright direction (Z-direction). Distances between the pin-like members 123c are such distances with which the pin-like members 123c do not interfere with vertical movement of the transport arm 11a. Hence, in this structure, the substrate container portions WA are gap spaces between the stacked layers of the stacked pins.

The substrate transfer buffers 130 shown in FIG. 1 as well each include three pin-like members (not shown) which are arranged within an approximately horizontal range which is smaller than the size of a substrate. Although the pin-like members support the substrate 2, since there is only one layer of the pin-like members, only one substrate 2 can be placed on each substrate transfer buffer 130.

Figure 9:
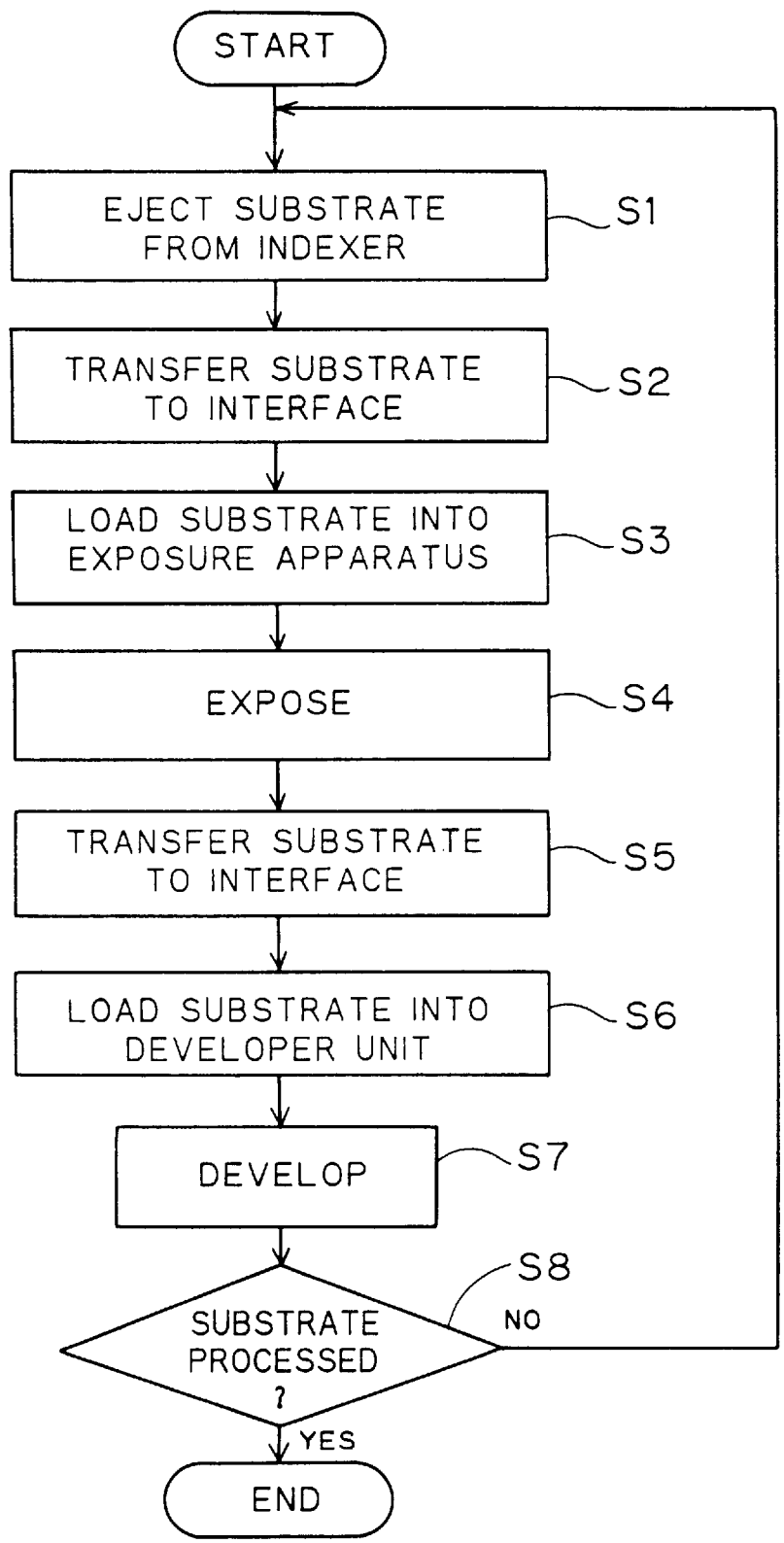
FIG. 9 is a flow chart for describing an operation of the substrate processing apparatus according to the preferred embodiment.
Figure 10:
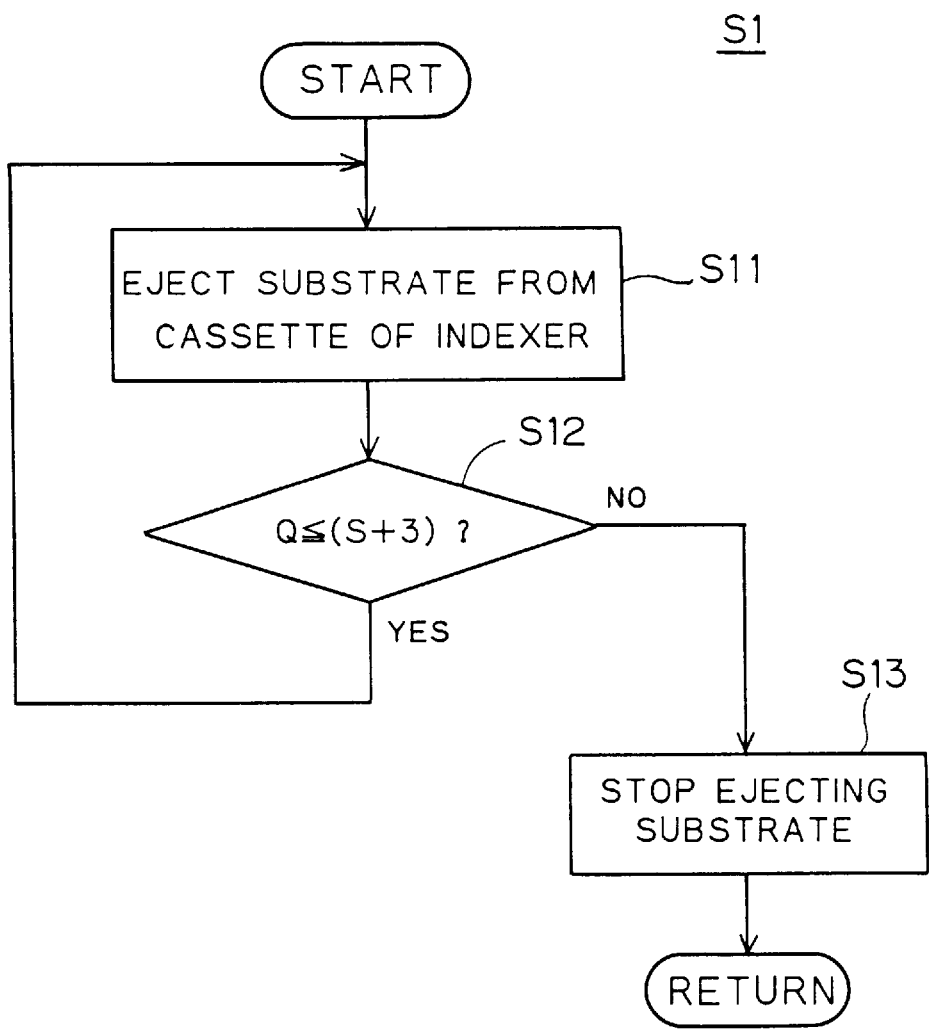
FIG. 10 is a flow chart for describing an example of controlled ejecting of a substrate from a cassette.
Figure 11:
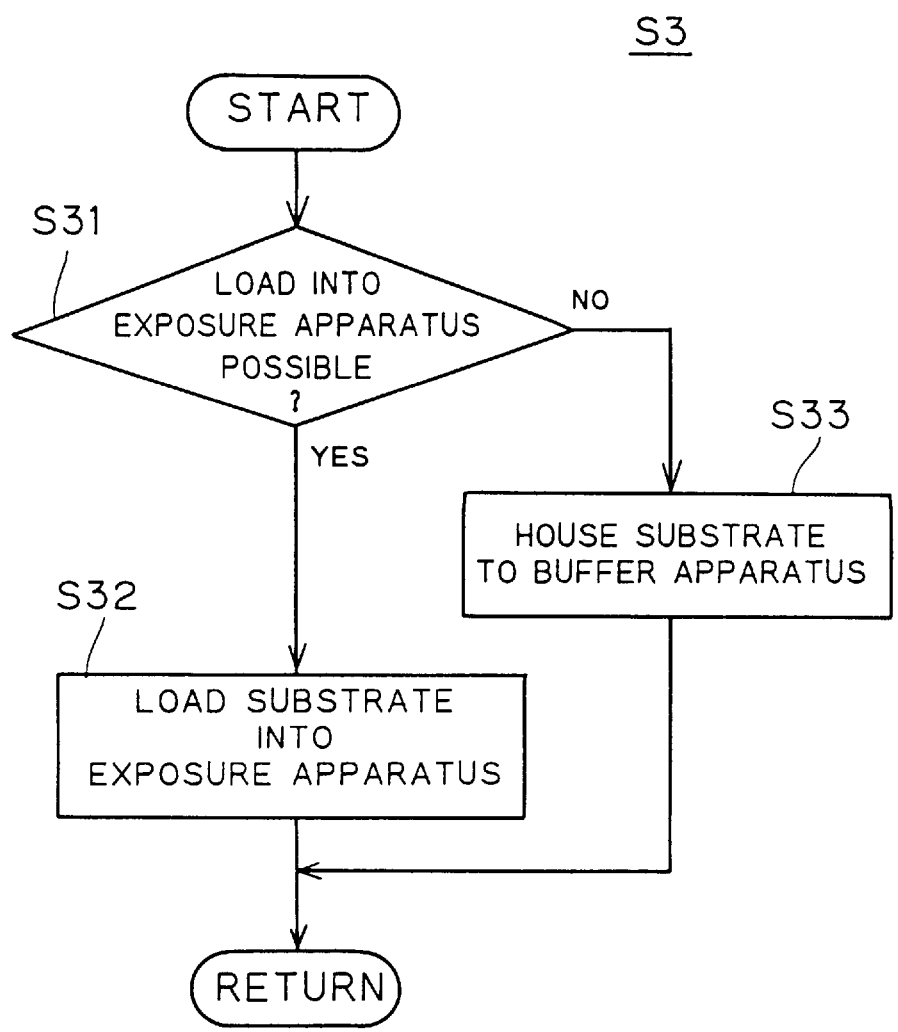
FIG. 11 is a flow chart for describing loading of a substrate into an exposure unit.
Figure 12:
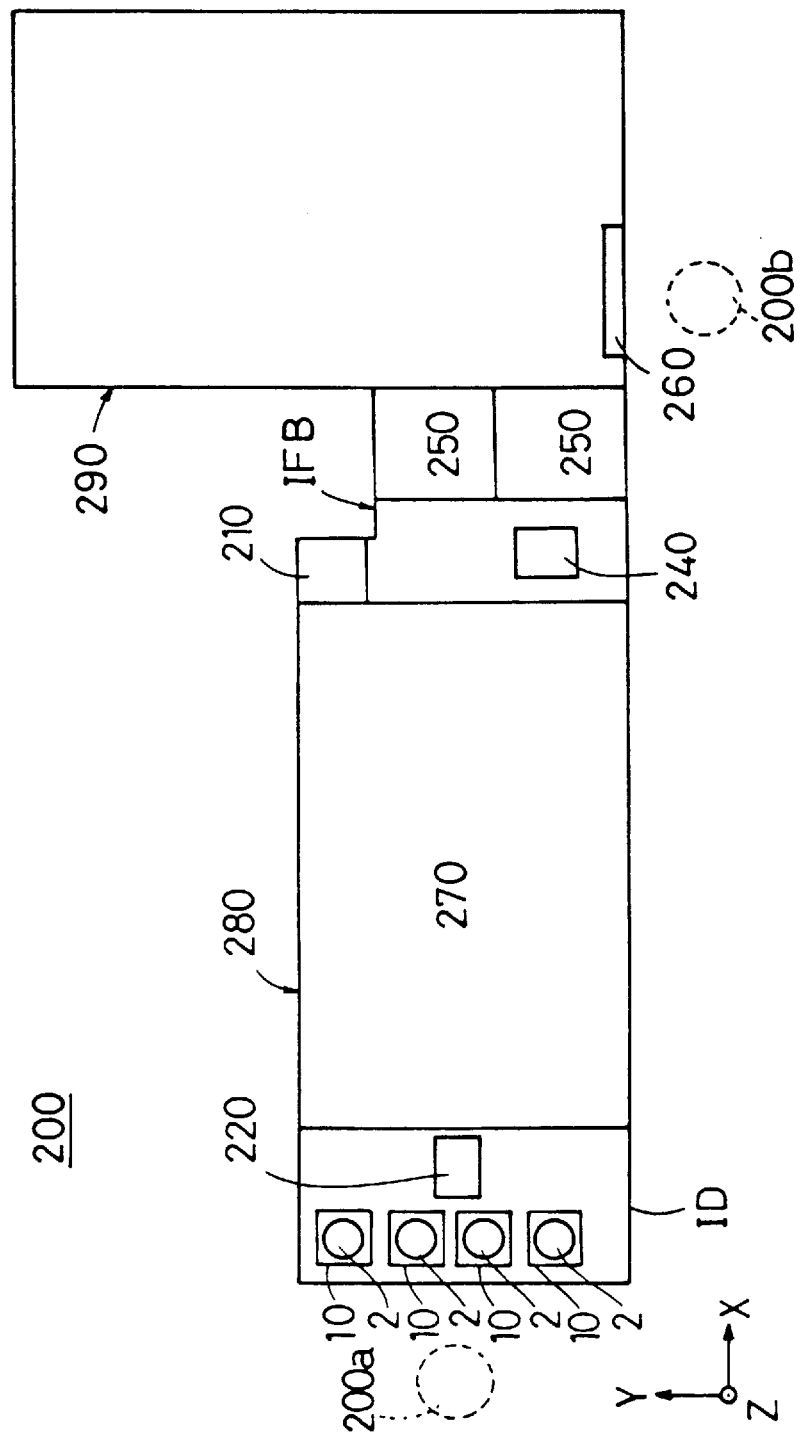
FIG. 12 is a conceptual plan view of a conventional substrate processing apparatus.

B. Sequence of Processing Substrate within Substrate Processing Apparatus:

FIGS. 9 to 11 are flow charts showing a sequence in which the substrates 2 is processed in the substrate processing apparatus 100. In the following, the sequence of processing of the substrates 2 will be described with reference to FIGS. 9 to 11.

First, the indexer IDA ejects the substrates 2 (Step S1). The control part 115 which is shown in FIG. 1 controls ejection of the substrates 2. The control part 115 includes a micro computer, etc., and automatically controls in a sequence described below.

FIG. 10 is a flow chart showing a sequence of ejection of the substrates 2. At Step S11, the substrate load/unload apparatus 110 ejects the substrate 2 from the cassette 10 of the indexer IDA. Next, at Step S12, it is judged whether ejection of the substrates 2 is to be continued, considering the following matters.

First, the control part 115 includes a register which stores how many substrates are currently contained in each processing unit and each part of the interface mechanism IFD in the substrate processing apparatus 100. The number of the substrates may be found based on a history of concluded ejection of the substrates or a history of transportion of the substrates to the respective parts of the substrate processing apparatus 100. Alternatively, the number of the substrates may be found by detecting a transportation condition of each substrate by substrate existence detecting sensors which are disposed to the respective parts of the apparatus.

By the way, after ejected from the indexer IDA, each substrate is transported to the respective parts in the following order before reaching the exposure unit 170:

(1) Substrate load/unload apparatus 110
(2) Substrate transport apparatus TR1
(3) Substrate transfer apparatus 140
(4) Substrate transport apparatus TR2
(5) Substrate transfer buffer 130
(6) Exposure unit 170

At the exposure unit 170, the substrate is exposed. Following this, the substrate is returned to the developer unit 160 in the following order:

(7) Substrate transfer buffer 130
(8) Substrate transport apparatus TR2
(9) Substrate transfer apparatus 140

At the developer unit 160, the substrate is subjected to developing, edge exposure and related heating treatments.

To correspond to this, the control part 115 refers to the register above to learn how many substrates are currently contained in the path from the parts (1) to (9) (hereinafter "inter-processing unit reciprocal path"). The number Q of the substrates is compared with a reference number at Step S12 shown in FIG. 10. The reference number is set as the sum (S+3) of a maximum number S of substrates which can be contained within the exposure unit 170 and the figure "3."

The figure (S+3) is calculated in the following manner. As one of the states in which ejection and transporting of the substrates are smoothly performed, the following state in the inter-processing unit reciprocal path is considered:

S substrates in the exposure unit 170;

one substrate in the substrate load/unload apparatus 110; one substrate in the substrate transfer apparatus 140; and one substrate in one of the substrate transfer buffers 130. When there is such a state, of the components which form the inter-processing unit reciprocal path above, presence of the substrates in the substrate transport apparatus TR1 and the substrate transport apparatus TR2 is not allowable. This is because if there is a substrate in the substrate transport apparatus TR1 and the substrate transport apparatus TR2, the apparatus as a whole is in "an impasse" condition so that the subsequent transportation step cannot be performed. The substrate container cassette 120, which temporarily houses substrates, need not be considered.

For this reason, the number Q of the substrates which are currently in "the inter-processing unit reciprocal path" is compared with the reference number (S+3). If the number Q of the substrates is equal to or smaller than the reference number (S+3), the sequence returns to ejecting at Step S11 of FIG. 10 to eject the next substrates. Otherwise, since "the apparatus enters an impasse condition if further ejection of substrates is performed" in such a case, ejection of substrates is stopped (Step S13) and the sequence waits until processing and transportation of substrates progress within the apparatus so that the conditions for Step S12 are satisfied. The maximum number S of substrates which can be contained within the exposure unit 170 may be S=3, for instance. Hence, in this example, ejection is stopped when the number Q of the substrates in the inter-processing unit reciprocal path exceeds 6. The maximum number S of substrates which can be contained within the exposure unit 170 can be changed optionally depending on the structure of the exposure unit.

By controlling the number of substrates which are ejected in the manner described above, there is no possibility that more substrates 2 than allowed will be ejected from the interface mechanism IFD into the inter-processing unit reciprocal path, and therefore, substrates are processed smoothly.

Referring to FIG. 9 once again, the substrates 2 which are ejected from the indexer IDA are received by the substrate transport apparatus TR2 of the interface mechanism IFD through the substrate transport apparatus TR1 and the substrate transfer apparatus 140 (Step S2). Following this, after moving to an appropriate position, the substrate transport apparatus TR2 loads the substrate 2 into the exposure unit 170 through the substrate transfer buffers 130 (Step S3). If it is impossible to transfer the substrates 2 due to trouble (e.g., the timing of transferring is not matched), the substrates 2 are housed into the substrate container cassette 120, as shown in FIG. 11 (Step S33). On the other hand, if there is no trouble, the substrate 2 is loaded into the exposure unit 170 and processing of the substrates is continued. The substrate 2 which is loaded into the exposure unit 170 is exposed (Step S4), and received by the substrate transport apparatus TR2 of the interface mechanism IFD through the substrate transfer buffers 130 (Step S5).

Next, after moving to a position which faces the substrate transfer apparatus 140 of the developer unit 160, the substrate transport apparatus TR2 loads the substrate 2 into the developer unit 160 through the substrate transfer apparatus 140 (Step S6). Following this, the substrate 2 is subjected to developing by the edge exposure apparatus EEW, the spin developers SD1, SD2, the heating apparatuses HP1 to HP7, CP1, CP2 which are disposed within the developer unit 160 (Step S7).

Next, whether processing of the substrates is finished is judged (Step S8). If processing is not finished, the sequence returns to Step S1 to eject the substrate 2 from the indexer IDA.

Modification:

While the foregoing has described an example wherein the present invention is realized, the present invention is not limited to the example above. For instance, instead of forming the substrate processing apparatus as a combination of the developer unit, the interface mechanism and the exposure unit, the substrate processing apparatus may be formed by combining other substrate processing units and the interface mechanism.

Further, although the substrate container cassette 120 includes three pin-like members in the example above, four or more pin-like members may be disposed to the substrate container cassette 120.

In addition, although the support members of the substrate container cassette 120 are preferably pin-like members as in the preferred embodiment described above so as to reduce the contact area with a substrate, this is not limiting. Rather, a substrate may be supported at its back by members which have other structure and are arranged in a non-linear configuration within an approximately horizontal range that is smaller than the plan size of a substrate.

While the invention has been described in detail, the foregoing description is in all aspects illustrative and not restrictive. It is understood that numerous other modifications and variations can be devised without departing from the scope of the invention.

I claim:

1. A cassette for containing a plurality of substrates, comprising:

a) a plurality of supporting means alternately stacked with gap spaces, each of said plurality of supporting means including a plurality of top points to horizontally support one substrate, said plurality of top points being horizontally distributed within an area smaller than a size of each substrate; and b) holding means for holding said plurality of supporting means.

2. The cassette of claim 1, wherein each supporting means has a-1) a floor plate, and a-2) a plurality of pins equipped on said floor plate, and said holding means has b-1) upright members across which said floor plate of each supporting means is bridged, wherein respective top ends of said plurality of pins constitute plurality of top points.

3. The cassette of claim 2, wherein said upright members are upright walls.

4. The cassette of claim 1, wherein each supporting means includes a-1) a plurality of L-shaped rods having respective top ends that constitute said plurality of top points, and said holding means includes c-1) a wall member to which said plurality of L-shaped rods are attached.

5. An interface between first and second processing units for processing substrates, said interface comprising:

a) a substrate buffer for buffering transportation of substrates between said first and second processing units; and b) a handling mechanism operable to take each substrate into and out of said substrate buffer, wherein said substrate buffer includes a-1) a plurality of supporting means alternately stacked with gap spaces, each of said plurality of supporting means having a plurality of top points to horizontally support one substrate, said plurality of top points being distributed horizontally within an area smaller than a size of each substrate; and a-2) holding means for holding said plurality of said supporting means.

6. The interface of claim 5, wherein said handling mechanism has a hand having fingers partially surrounding an outline of each substrate without touching said outline; and a plurality of projections projecting from said fingers to support each substrate.

7. An apparatus for processing substrates, comprising:

a) first and second processing units for processing substrates; and b) an interface provided between said first and second processing units, having
   b-1) a substrate buffer for buffering transportation of substrates between said first and second processing units; and
   b-2) a handling mechanism operable to take each substrate into and out of said substrate buffer, wherein said substrate buffer includes
   b-1-1) a plurality of supporting means alternately stacked with gap spaces, each of said plurality of supporting means including
      a plurality of top points to horizontally support one substrate, said plurality of top points being distributed horizontally within an area smaller than a size of each substrate; and
   b-1-2) holding means for holding said plurality of supporting means.

8. The apparatus of claim 7, wherein said first processing unit has a first accessible side for manual operation, said second processing unit has a second accessible side for manual operation, and said first and said second accessible sides being directed to a same direction.

9. The apparatus of claim 8, wherein said first accessible side is aligned with said second accessible side.

10. The apparatus of claim 7, wherein respective substrates are serially transported along a shuttle path including a forward path starting from said first processing unit to said second processing unit via said interface, and a back path coming back to said first processing unit from said second processing unit via said interface, and said first processing unit has a-1) a loader for serially loading respective substrates in said first processing unit, and a-2) transfer means for serially transferring respective substrates to said interface, said apparatus further comprising:

c) means for counting the number of substrates currently present in said shuttle path;

d) means for comparing the number of said substrate with a reference number; and e) means for controlling said loader to interrupt loading of new substrates while said the number of said substrate exceeds said reference number.

11. The apparatus of claim 10, wherein said second processing unit is an exposure unit for exposing a photoresist layer provided on each substrate, and said first processing unit has a developer for developing said photoresist layer after said photoresist layer has been exposed in said exposure unit.

12. An apparatus for processing substrates, comprising:

a) first and second processing units for processing substrates; and b) an interface provided between said first and second processing units, wherein said first processing unit has a first accessible side for manual operation, said second processing unit has a second accessible side for manual operation, and said first and second accessible sides being directed to a same direction.

13. The apparatus of claim 12, wherein said first accessible side is aligned with said second accessible side.

14. A method of processing substrates, comprising steps:

a) of providing first and second processing units for processing substrates and providing an interface between said first and second processing units;

b) of serially loading respective substrates in said first processing unit;

c) of serially transferring respective substrates to said second processing unit via said interface;

d) of serially processing respective substrates in said second processing unit;

e) of serially feeding respective substrates back to said first processing unit via said interface; and f) of serially processing respective substrates in said first processing unit, the step b) including steps:
   b-1) of counting the number of substrates currently subjected to said steps c) to e);
   b-2) of comparing the number of said substrates with a reference number; and
   b-3) of interrupting the step b) while the number of said substrates exceeds said reference number.

15. The method of claim 14, wherein said second processing unit is an exposure unit for exposing a photoresist layer provided on each substrate, and said first processing unit includes a developer for developing said photoresist layer after said photoresist layer is exposed in said exposure unit.

* * * * *